United States Patent [19]

Oda et al.

[11] Patent Number: 4,737,662

[45] Date of Patent: Apr. 12, 1988

[54] DIFFERENTIAL PHASE SHIFTER

[75] Inventors: Minoru Oda; Yukio Nishizawa, both of Kobe, Japan

[73] Assignee: Mitsubishi Denki Kabushiki Kaisha, Tokyo, Japan

[21] Appl. No.: 921,240

[22] Filed: Oct. 21, 1986

[30] Foreign Application Priority Data

Oct. 22, 1985 [JP] Japan .................. 60-234459

[51] Int. Cl.$^4$ .......................... H03K 5/00; H03L 3/00
[52] U.S. Cl. .................... 307/262; 307/511; 328/155
[58] Field of Search ............... 307/511, 512, 262; 328/155, 55, 163

[56] References Cited

U.S. PATENT DOCUMENTS

| 3,322,970 | 5/1967 | Batteau | 307/511 |
| 3,500,217 | 3/1970 | Allen | 307/512 |
| 3,590,284 | 6/1971 | Yamane | 307/511 |
| 3,612,916 | 10/1971 | O'Neill | 307/262 |
| 3,800,265 | 3/1974 | Yoshioka et al. | 307/262 |

Primary Examiner—Stanley D. Miller
Assistant Examiner—Timothy P. Callahan
Attorney, Agent, or Firm—Leydig, Voit & Mayer

[57] ABSTRACT

A phase shifter according to this invention comprises circuit groups on a phase advance side and on a phase retardation side in each of which N phase shifting circuits of constant amplitude are connected in cascade, and in which the time constants of the successive phase shifting circuits are set at a geometrical progression of a fixed ratio $\alpha$, while the time constants of the phase shifting circuits on the phase retardation side are made $\beta$ times greater than those of the corresponding phase shifting circuits on the phase advance side. Thus, any desired phase difference can be attained according to the value $\alpha$, while a desired phase difference can be attained according to the value $\beta$, and the limits of a frequency band width are eliminated by increasing the number of stages N of the cascade connection of each circuit group.

14 Claims, 3 Drawing Sheets

DIFFERENTIAL PHASE SHIFTER

BACKGROUND OF THE INVENTION

This invention relates to a phase shifter for use in the field of radio communications, etc., and more particularly to a phase shifter which derives two signals of fixed phase difference without changing the amplitudes of the signals over a wide frequency band.

FIG. 6 is a circuit diagram which shows a prior-art phase shifter referred to as a Nagard type for creating a phase difference of 90° by way of example. In the figure, 1 designates an input terminal, and 2 an amplifier for amplifying a signal from the input terminal 1. 3 and 5 designate resistors between which a capacitor 4 is inserted, and the resistors 3, 5 and the capacitor 4 constitute a series circuit connected across both the ends of the amplifier 2. A capacitor 6 is connected across both the ends of the resistor 3, and a first output terminal 7 is provided at the node of the resistor 3 and the capacitors 4, 6. 8 and 10 designate resistors between which a capacitor 9 is inserted, and the resistors 8, 10 and the capacitor 9 constitute a series circuit connected across both the ends of the amplifier 2. A capacitor 11 is connected across both the ends of the resistor 8, and a second output terminal 12 is provided at the node of the resistor 8 and the capacitors 9, 11.

Here, it is assumed that $4R_1C_1 = R_2C_2$ be satisfied when the gain of the amplifier 2 is set at $-(7/2)$ and when as circuit constants, the resistances of the resistors 5, 10, 3 and 8 are $R_1$, $R_2$, $(4/3) R_1$ and $(4/3) R_2$ respectively, while the capacitances of the capacitors 6, 11, 4 and 9 are $C_1$, $C_2$, $2C_1$ and $2C_2$ respectively.

At this time, the characteristic of the phase shifter in FIG. 6 is as shown in FIG. 7 wherein the phase is taken on the axis of ordinates and the frequency on the axis of abscissas. As seen from FIG. 7, the frequency band width in which the phase shifter operates effectively as a 90° phase shifter is about one decade (250–2500 Hz), and the phase precision (deviations from 90°) on that occasion is about ±1°. Analysis has also revealed that the alteration of the circuit constants can improve the phase precision, but that it narrows the effective band width.

Since, as described above, the prior-art phase shifter has the frequency band width and the phase precision restricted by one set of circuit constants, it has had the problem that more improvements in performance cannot be expected.

SUMMARY OF THE INVENTION

This invention has as its main objective to solve the problem mentioned above, and has for its object to provide a phase shifter the effective band width and the phase precision of which are not limited.

The phase shifter according to this invention comprises circuit groups on a phase advance side and on a phase retardation side in each of which N phase shifting circuits of constant amplitude are connected in cascade, and in which the time constants of the successive phase shifting circuits are set at a geometrical progression of fixed ratio $\alpha$, while the time constants of the phase shifting circuits on the phase retardation side are made $\beta$ times greater than those of the corresponding phase shifting circuits on the phase advance side.

In this invention, any desired precision can be attained according to the way of determination of the time constants of the phase shifting circuits in the circuit groups, namely, according to the value $\alpha$, while a desired phase difference is attained according to the way of determination of the time constants of the phase retardation side relative to those of the phase advance side, namely, according to the value $\beta$, and further, the limits of the frequency band width are eliminated due to the additive property of the phases of cascade connected circuits, in other words, by increasing the number of stages N of the cascade connection.

DESCRIPTION OF THE PREFERRED EMBODIMENTS

Figure 1:
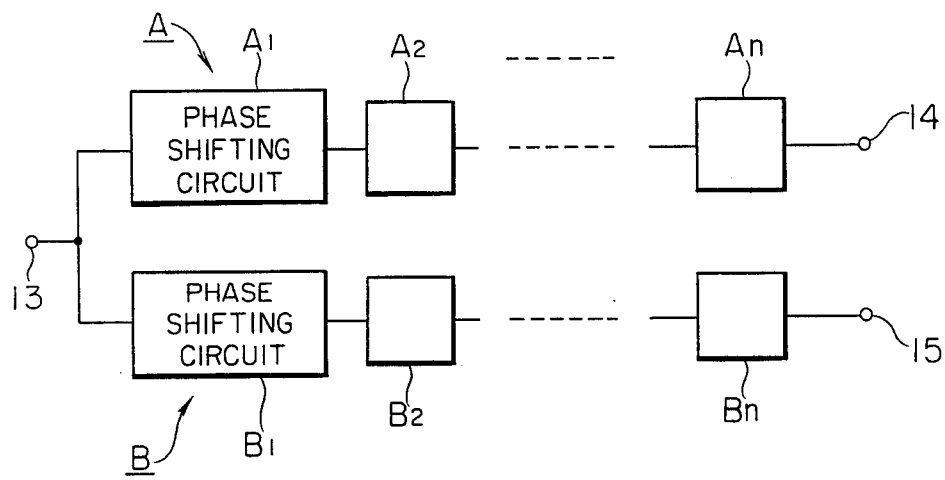
FIG. 1 is a block diagram showing an embodiment of this invention.

Now, an embodiment of this invention will be described with reference to the drawings. FIG. 1 is a block diagram showing an embodiment of this invention. In the figure, 13 designates an input terminal, 14 an output terminal on a phase advance side, and 15 an output terminal on a phase retardation side. Letter A indicates a circuit group on the phase advance side which is inserted between the input terminal 13 and the phase advance side output terinal 14, and which consists of N phase shifting circuits of constant gain (hereinbelow, simply termed "phase shifting circuits") $A_1$-$A_n$ connected in cascade. Letter B indicates a circuit group on the phase retardation side which is inserted between the input terminal 13 and the phase retardation side output terminal 15, and which consists of N phase shifting circuits $B_1$-$B_n$ connected in cascade.

Figure 2:
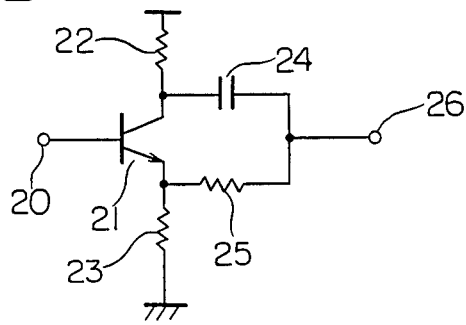
FIG. 2 is a circuit diagram showing a phase shifting circuit which serves as each constituent in FIG. 1.

FIG. 2 is a circuit diagram showing each of the phase shifting circuits $A_1$-$A_n$ and $B_1$-$B_n$ which are the constituents of the respective circuit groups A and B. In the figure, 20 designates an input terminal, 21 a grounded-emitter transistor whose base is connected to the input terminal 20, 22 a resistor which is connected to the collector of the transistor 21, and 23 a resistor which is connected between the emitter of the transistor 21 and the ground. 24 denotes a capacitor which is connected to the collector of the transistor 21, 25 a resistor which is connected to the emitter of the transistor 21, and 26 an output terminal which is connected to the node between the capacitor 24 and the resistor 25.

Here letting the capacitance of the capacitor 24 be C and the resistance of the resistor 25 be R, the time constant $\tau$ of the phase shifting circuit in FIG. 2 is expressed by CR. Accordingly, the circuit constants of the respective phase shifting circuits $A_1$-$A_n$ and $B_1$-$B_n$ are determined by properly selecting the values CR. The input/output transfer characteristic $F(\omega)$ of the phase shifting circuit shown in FIG. 2 is expressed by:

$$F(\omega) = [1/(1+j\omega CR)] - [j\omega CR/(1+j\omega CR)] \quad (1)$$
$$= (1-j\omega CR)/(1+j\omega CR)$$

In addition, the gain M and phase of the transfer function of Eq. (1) are respectively give by:

$$M = |(1-j\omega CR)/(1+j\omega CR)| = 1 \quad (2)$$
$$\phi = \tan^{-1}[(1-j\omega CR)/(1+j\omega CR)] \quad (3)$$
$$= \tan^{-1}[-2\omega CR/(1-\omega^2 C^2 R^2)]$$

Figure 3:
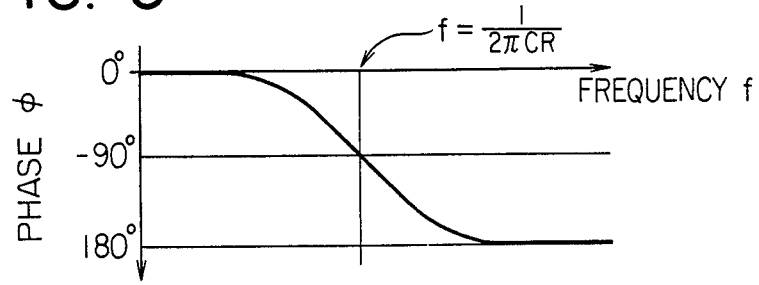
FIG. 3 is a graph showing the frequency-phase characteristic of the phase shifting circuit in FIG. 2.

It is understood from Eq. (2) that, with the input/output characteristic of the phase shifting circuit in FIG. 2, the gain M is constant (=1) irrespective of a frequency f (=$\omega/2\pi$). It is also understood from Eq. (3) that the phase $\phi$ varies continuously from 0 to $-\pi$ with the increase of the frequency f. FIG. 3 illustrates the phase characteristic in which:
the phase $\phi=0$ for an angular frequency $\omega=0$,
$\phi=-\pi/2$ for $\omega=1/CR$ (i.e., $f=1/2\pi CR$), and
$\phi=-\pi$ for $\omega=\infty$
hold.

Next, the function of the phase shifter shown in FIG. 1 will be described. The respective phase shifting circuits $A_1$-$A_n$ in the phase advance side circuit group A have their time constants $\tau a_1$-$\tau a_n$ set at a geometrical progression which decreases successively toward the output side. Letting $\alpha$ denote the ratio of the adjacent time constants ($\tau a_{i-1}/\tau a_i$), the following holds:

$$\tau a_1/\tau a_2 = \tau a_2/\tau a_3 = \ldots = \tau a_{n-1}/\tau a_n = (\alpha 4)$$

where $\alpha>1$.

The respective phase shifting circuits $B_1$-$B_n$ in the phase retardation side circuit group B are similarly arranged. That is, their time constants $b_1$-$b_n$ satisfy:

$$\tau b_1/\tau b_2 = \tau b_2/\tau b_3 = \ldots = \tau b_{n-1}/\tau b_n = \alpha \quad (5)$$

Here, the circuit group A on the phase advance side will be referred to by way of example. The input/output transfer characteristic $Fa(\omega)$ thereof becomes the product of the value of Eq. (1) multiplied for the N phase shifting circuits $A_1$-$A_n$, that is:

$$Fa(\omega) = \pi[(1-j\omega\tau a_i)/(1+j\omega\tau a_i)] \quad (6)$$

$(i=1\sim n)$
where $\tau a_i = C_i R_i$.
In addition, in view of Eq. (2), the gain Ma is:

$$Ma = 1 \quad (7)$$

Besides, the phase a becomes the summation of the value of Eq. (3) for the n stages that is:

$$\phi a = \Sigma \tan^{-1}[-2\omega\tau a_i/(1-\omega^2\tau a_i^2)] \quad (8)$$

$(i=1\ldots n)$

Figure 4:
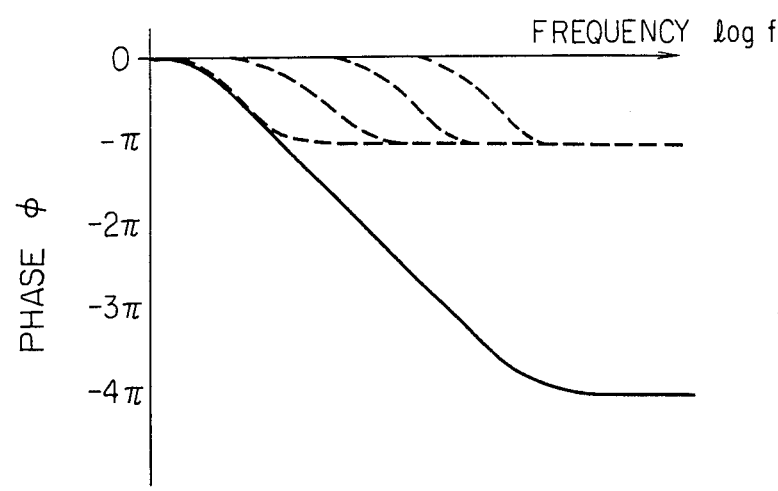
FIG. 4 is a graph showing the frequency-phase characteristic of a phase advance side circuit group in FIG. 1.

FIG. 4 depicts the phase characteristic of Eq. (8), in which broken line indicate the phase characteristics of the respective stages $A_1$-$A_n$, while a solid line indicates the phase characteristic of the whole circuit group A. As seen from FIG. 4, the phase characteristic of the circuit group A on the phase advance side has an inclination part which has a rectilinear relation to the logarithmic frequency, and the mean gradient is expressed by:

$$d\phi/d(\log f) = -\pi/\log(f_{i+1}/f_i) \quad (9)$$
$$= -\pi/\log(\tau a_i/\tau a_{i+1})$$
$$= -\pi/\log\alpha$$

However, this is the mean gradient, and the fluctuation of the gradient enlarges when the value $\alpha$ is increased.

Here, while the relations of Eqs. (4) and (5) are held, the following relationship is established so that the time constants of the phase shifting circuits of the respective stages in the phase retardation side circuit group B may become $\beta$ times those of the phase shifting circuits of the corresponding stages in the phase advance side circuit group A:

$$\tau b_1/\tau a_1 = \tau b_2/\tau a_2 = \ldots = \tau b_n/\tau a_n = \beta \quad (10)$$

where $\beta>1$.
Then, a fixed phase difference $\Delta\phi$ appears between the output of the phase advance side circuit group A and that of the phase retardation side circuit group B. According to Eqs. (9) and (10) and $\tau i=1/(2\pi f_i)$, the following holds:

$$\Delta\phi = [d\phi/d(\log f)] \cdot \Delta\log f \quad (11)$$
$$= [d\phi/d(\log f)] \cdot (-\Delta\log\tau)$$
$$= (-\pi/\log\alpha) \cdot (-\log\beta).$$

A condition for putting this phase difference $\Delta\phi$ to 90° is:

$$\Delta\phi = \pi/2 \quad (12)$$

From Eqs. (11) and (12), therefore, $$\log\beta/\log\alpha = 1/2$$
$$\therefore \beta = \alpha^{0.5} \quad (13)$$

Accordingly, when Eq. (13) is met, the phase difference between the output terminals (14) and (15) in FIG. 1 can be held at 90°. However, this holds true in only the frequency range of the phase inclination part stated before.

In addition, it is to be understood that when the number of stages n of the phase shifting circuits in the respective circuit groups A and B of FIG. 1 is increased, the fixed phase difference and amplitude characteristic are attained over a limitlessly wide frequency band. As illustrated in FIG. 4, however, the phase inclination part is not a perfect straight line but has a reverse-S shape with the gradient lessened at both ends, so that the phase difference tends to decrease at the ends of the band. In order to expand the effective band width as a phase shifter, therefore, the number of stages n of the phase shifting circuits needs to be accordingly large, and this number of stages n naturally increases more as the phase precision aimed at is higher.

Accordingly, in a case where the number N of the phase shifting circuits cannot be considerably increased on account of the limitation of space, etc., a method is further adopted in which the time constants of the phase shifting circuits at the ends in the circuit groups A and B are corrected to reduce the loss of the effective band width.

As the first step, the minimum time constant $\tau a_n$ among the time constants $\tau a_1-\tau a_n$ of the respective phase shifting circuits $A_1-A_n$ in the phase advance side circuit group A is made smaller than the value obtained with Eq. (4), and the maximum time constant $\tau b_1$ among the time constants $\tau b_1-\tau b_n$ of the respective phase shifting circuit $B_1-B_n$ in the phase retardation side circuit group B is made larger than the value obtained with Eq. (5). That is:

$$\tau a_{n-1}/\tau a_n = k\alpha \qquad (14)$$

$$\tau b_1/\tau b_2 = k\alpha \qquad (15)$$

where $k>1$.

By changing the time constants $a_n$ and $b_1$ of the respective phase shifting circuits $A_n$ and $B_1$ at the ends of the circuit groups A and B as indicated by Eqs. (14) and (15), the basic flatness of the magnitude of the phase shift is attained, and the mean value of the differential coefficients of the second order over the whole effective band can be made zero. The value of a fixed ratio k, that is the magnitude of the change somewhat differs depending upon the number of cascade stage n and the value $\alpha$, but should preferably be between approximately 1.0 and 2.0.

A similar functional effect is achieved even when, contrary to the foregoing, the maximum time constant $\tau a_1$ in the phase advance side circuit group A is made smaller and the minimum time constant $\tau b_n$ in the phase retardation side circuit group B is made larger. This method, however, is not very favorable because the band width acquired becomes narrower than with the foregoing method.

In a case where, even when the time constants $\tau a_n$ and $\tau b_1$ in the respective circuit groups A and B have thus been altered by the first step, the correction of one stage corresponding to either end of the effective band might be still insufficient to contribute to the effective band, the following method is further adopted:

As the second step, the maximum time constant $\tau a_1$ among the time constants $\tau a_1-\tau a_n$ of the respective phase shifting circuits $A_1-A_n$ in the phase advance side circuit group A is made larger than the value obtained with Eq. (4), and the minimum time constant $\tau b_n$ among the time constants $\tau b_1-\tau b_n$ of the respective phase shifting circuits $B_1-B_n$ in the phase retardation side circuit group B is made smaller than the value obtained with Eq. (5). That is:

$$\tau a_1/\tau a_2 = k'\alpha \qquad (16)$$

$$\tau b_{n-1}/\tau b_n = k'\alpha \qquad (17)$$

where $k'>1$.

In this case, the value of a fixed ratio $k'$ should preferably be approximately 1.0 to 1.5. The corrections of the band ends are completed upon executing the alterations of the second step as indicated by Eqs. (16) and (17).

By the above adjustments of the first step and the second step, the number N of the phase shifting circuits can be minimized, and the circuit arrangement in FIG. 1 can be realized in a small space and economically.

Figure 5:
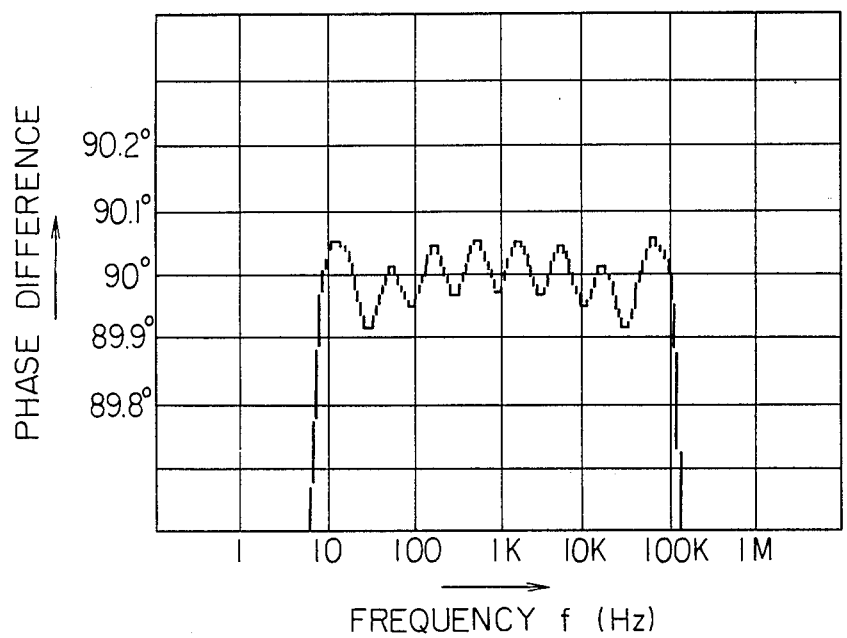
FIG. 5 is a graph showing the frequency-phase characteristic of the phase shifter in FIG. 1.

FIG. 5 is a diagram of a phase shifting characteristic according to one example of design of this invention, and illustrates a performance obtained in a case where $n=10$, $\alpha=10^{0.5}$ and $\beta=10^{0.25}$ are set and where the aforementioned magnitudes of corrections are set at the optimum analytical values of $k=1.94$ and $k'=1.08$ by way of example. As seen from FIG. 5, the effective band width is 4 decades, and the magnitude of phase shift is $90°\pm0.1°$. It is accordingly understood that the band width in which the phase shifter operates effectively as a 90° phase shifter is about four decade (10 Hz-100 kHz) and that the phase precision (deviations from 90°) then attained is about $\pm0.1$. Besides, $\alpha$ which is the parameter basically determining the phase precision becomes a requirement for the number of constituent stages n of the circuit groups A and B necessary for attaining the effective band width. Since when the value of the parameter increases, the phase precision decreases to the same degree, assuming that the phase precision aimed at is $\pm1°$ or $\pm0.1°$, for example, the necessary maximum value of $\alpha$ becomes $10^{0.7}$ ($\approx 5.0$) or $10^{0.5}$ ($\approx 3.16$) respectively.

In the above embodiment, the time constants $\tau a_1-\tau a_n$ and $\tau b_1-\tau b_n$ of the phase shifting circuits $A_1-A_n$ and $B_1-B_n$ in the circuit groups A and B have been respectively set at geometrical progressions which decrease according to $1/\alpha$ successively toward the output sides. Since, however, the input/output transfer characteristic $f_a(\omega)$ and the phase $\phi_a$ are respectively the multiple product and the summation with the number of stages N as apparent from Eq. (6) and Eq. (8), they are quite unimportant to the connection sequences of the phase shifting circuits. Needless to say, accordingly, similar effects are achieved even when geometrical progressions which to the contrary increase according to $\alpha$ times successively toward the output sides are used, or when the phase shifting circuits are connected irrespective of the magnitudes of the time constants.

While the case of realizing that 90° phase shifter has been described, a case of aiming at a phase difference unequal to 90° may be dealt with by properly altering the logarithm of $\beta$ in proportion to the target phase angle as seen from Eq. (11).

Figure 6:
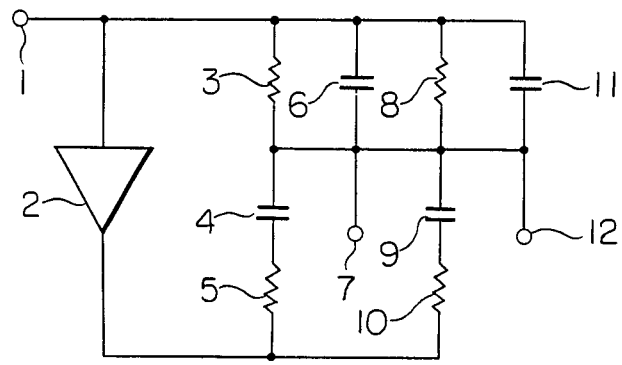
FIG. 6 is a circuit diagram showing a prior-art phase shifter.
Figure 7:
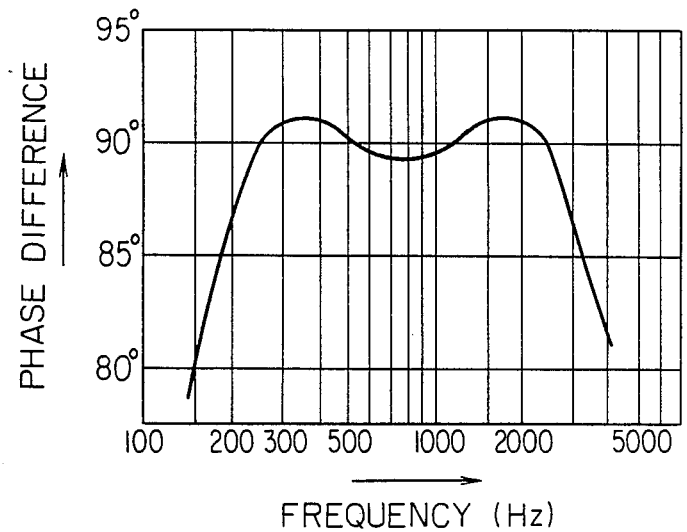
FIG. 7 is a graph showing the frequency-phase characteristic of the phase shifter in FIG. 6.

Moreover, the phase shifting circuit shown in FIG. 2 can obviously be replaced with another circuit, and the prior-art circuit in FIG. 6 may well be employed by way of example. In this case, the transfer characteristic $F(\omega)$ of the circuit in FIG. 6 becomes:

$$F(\omega)=(2/9)(3-9j\omega C-2\omega^2 C^2 R^2)/(3+9j\omega CR-2\omega^2 C^2 R^2) \qquad (18)$$

As understood from Eq. (18), the circuit in FIG. 6 has a constant-amplitude phase shifting characteristic of $2\pi$ and can be used as each of the phase shifting circuits $A_1-A_n$ and $B_1-B_n$ in FIG. 1. Although the circuit arrangement in FIG. 6 is complicated, it has the advantage that the number of stages n may be small when it is put into the cascade connection.

As described above, in accordance with this invention, a phase shifter comprises circuit groups on a phase advance side and a phase retardation side in each of which N phase shifting circuits of constant gain are connected in cascade, and in which the time constants of the successive phase shifting circuits are set at a geometrical progression of fixed ratio $\alpha$, while the time constants of the phase shifting circuits on the phase retardation side are made $\beta$ times greater than those of the corresponding phase shifting circuits on the phase advance side, whereby any desired precision is attained according to the value $\alpha$, while any desired phase difference is attained according to the value $\beta$, and any desired frequency band width is attained according to the number of stages N of the cascade connection. Therefore, the invention has the effect that a phase shifter is provided in which the effective band width and the phase precision are not limited.

What is claimed is:

1. A phase shifter comprising in combination a first group of N phase shifting circuits connected in cascade to form a phase advance circuit path, a second group of N phase shifting circuits connected in cascade to form a phase retardation circuit path, the inputs of the phase advance and phase retardation circuit paths being connected together for receiving an input signal, the outputs of the phase advance and phase retardation circuit paths being maintained separate and independent for producing an output having a differential phase shift, the gain of all the phase shifting circuits being the same, time constants of the successive phase shifting circuits being set at a geometrical progression of fixed ratio $\alpha$ where $\alpha > 1$, time constants of the phase shifting circuits in the phase retardation circuit path being greater than those of the corresponding phase shifting circuits in the phase advance circuit path by a fixed ratio $\beta$ in the range $1 < \beta < \alpha$, wherein the relationship of the phase shift ($\Delta\phi$), $\alpha$ and $\beta$ is controlled by the following relationship:

$$\Delta\phi = (d\phi/\log \alpha)\cdot(-\log \beta).$$

2. A phase shifter as defined in claim 1, characterized in that the fixed ratio $\beta$ equals to $\sqrt{\alpha}$.

3. A phase shifter as defined in claim 1 characterized in that the time constant of the phase shifting circuit having the smallest time constant in the phase advance circuit path is made smaller at a fixed ratio k than a value which is obtained by multiplying the second-smallest time constant by $1/\alpha$, while the time constant of the phase shifting circuit having the greatest time constant in the phase retardation circuit path is made greater at said fixed ratio k than a value which is obtained by multiplying the second-greatest time constant by $\alpha$.

4. A phase shifter as defined in claim 3, characterized in that the fixed ratio is 1.0 to 2.0.

5. A phase shifter as defined in claim 3 characterized in that the time constant of the phase shifting circuit having the greatest time constant in the phase advance circuit path is made greater at a fixed ratio k' than a value which is obtained by multiplying the second-greatest time constant by $\alpha$, while the time constant of the phase shifting circuit having the smallest time constant in the phase retardation circuit path is made smaller at the fixed ratio k' than a value which is obtained by multiplying the second-smallest time constant by $1/\alpha$.

6. A phase shifter as defined in claim 5, characterized in that the fixed ratio is 1.0 to 1.5.

7. A phase shifter as defined in claim 2 characterized in that the time constant of the phase shifting circuit having the smallest time constant in the phase advance circuit path is made smaller at a fixed ratio k than a value which is obtained by multiplying the second-smallest time constant by $1/\alpha$, while the time constant of the phase shifting circuit having the greatest time constant in the phase retardation circuit path is made greater at said fixed ratio k than a value which is obtained by multiplying the second-greatest time constant by $\alpha$.

8. A phase shifter as defined in claim 4 characterized in that the time constant of the phase shifting circuit having the greatest time constant in the phase advance circuit path is made greater at a fixed ratio k' than a value which is obtained by multiplying the second-greatest time constant by $\alpha$, while the time constant of the phase shifting circuit having the smallest time constant in the phase retardation circuit path is made smaller at the fixed ratio k' than a value which is obtained by multiplying the second-smallest time constant by $1/\alpha$.

9. A phase shifter as defined in claim 8 characterized in that the fixed ratio is 1.0 to 1.5.

10. A phase shifter as defined in claim 7 characterized in that the fixed ratio is 1.0 to 2.0.

11. A phase shifter as defined in claim 7 characterized in that the time constant of the phase shifting circuit having the greatest time constant in the phase advance circuit path is made greater at a fixed ratio k' than a value which is obtained by multiplying the second-greatest time constant by $\alpha$, while the time constant of the phase shifting circuit having the smallest time constant in the phase retardation circuit path is made smaller at the fixed ratio k' than a value which is obtained by multiplying the second-smallest time constant by $1/\alpha$.

12. A phase shifter as defined in claim 11 characterized in that the fixed ratio is 1.0 to 1.5.

13. A phase shifter as defined in claim 10 characterized in that the time constant of the phase shifting circuit having the greatest time constant in the phase advance circuit path is made greater at a fixed ratio k' than a value which is obtained by multiplying the second-greatest time constant by $\alpha$, while the time constant of the phase shifting circuit having the smallest time constant in the phase retardation circuit path is made smaller at the fixed ratio k' than a value which is obtained by multiplying the second-smallest time constant by $1/\alpha$.

14. A phase shifter as defined in claim 13 characterized in that the fixed ratio is 1.0 to 1.5.

* * * * *